United States Patent [19]

Reed

[11] Patent Number: 4,599,743
[45] Date of Patent: Jul. 8, 1986

[54] BASEBAND DEMODULATOR FOR FM AND/OR AM SIGNALS

[75] Inventor: Joseph Reed, Stamford, Conn.

[73] Assignee: ITT Corporation, New York, N.Y.

[21] Appl. No.: 658,957

[22] Filed: Oct. 9, 1984

Related U.S. Application Data

[63] Continuation-in-part of Ser. No. 342,442, Jan. 25, 1982, Pat. No. 4,476,585.

[51] Int. Cl.$^4$ .............................................. H04B 1/26
[52] U.S. Cl. ................................. 455/207; 455/209; 455/264; 455/316; 455/324; 329/50; 329/124
[58] Field of Search .............. 455/207, 208, 209, 214, 455/258, 264, 316, 318, 319, 324, 337, 42, 59, 60, 61, 141, 142, 143, 144; 329/50, 122, 124

[56] References Cited

U.S. PATENT DOCUMENTS 4,476,585 10/1984 Reed .................................... 455/207

Primary Examiner—Jin F. Ng
Assistant Examiner—Elissa Seidenglanz
Attorney, Agent, or Firm—John T. O'Halloran

[57] ABSTRACT

A demodulator of the type employed in a "zero-IF" system uses a local oscillator for providing quadrature output signals at the center frequency of a received signal to be demodulated. The demodulator has first and second mixers for separately mixing the received signal with the quadrature signals to provide a first and second output signal each in quadrature at the outputs of said mixers. These signals are low pass filtered. The demodulator includes third and fourth mixers with each mixer respectively receiving at an input one of the first and second low pass signals. At another input the mixers receive third and fourth signals. The third and fourth signals are derived from mixing a variable controlled oscillator (VCO) signal with local oscillator quadrature signals the frequency of said is independent of the center frequency of the received signal. The outputs of the third and fourth mixers are applied to the inputs of a difference amplifier, the output of which controls the frequency of the VCO in an automatic frequency control mode (AFC) to cause the output of the difference amplifier to provide demodulation of an FM signal. Additional mixers are provided which mix the first and second low pass signals respectively with the fourth and third signals, with the signals appearing at the outputs of such additional mixers being summed to provide demonstration of an AM signal independently of the FM demodulation.

5 Claims, 3 Drawing Figures

BASEBAND DEMODULATOR FOR FM AND/OR AM SIGNALS

CROSS-REFERENCE TO RELATED APPLICATIONS

This application is a continuation-in-part of my co-pending application Ser. No. 342,442, filed Jan. 5, 1982, now U.S. Pat. No. 4,476,585.

BACKGROUND OF THE INVENTION

This invention relates to a demodulator and more particularly to a baseband demodulator for FM and/or AM signals.

In regard to the field of radio receivers, there has been a concentrated effort over the past several years to reduce the amount of tuned circuitry employed in such devices. In obtaining a reduction in the number of tuned circuits, one is able to integrate large portions of the receiver and hence produce radio receivers which are extremely compact. These receivers are employed in many areas such as in selective paging systems and so on. A major breakthrough in the design of such receivers is a technique referred to as "zero-IF."

The zero-IF technique has been described in British Pat. No. 1,530,602 entitled DEMODULATOR FOR FM SIGNALS published on Nov. 1, 1978 for I. A. W. Vance. Essentially in such a system, there is present a receiver in which local oscillator signals in phase quadrature at the carrier frequency are each separately mixed with the incoming audio modulated signals. The resulting signals have zero-IF with the two sidebands folded over on each other at the baseband and extending in frequency from DC to the single sideband width of the original signal.

In the case of FM modulation the folding of the sidebands makes it difficult to demodulate the signal. In the British Patent the mixer outputs are low pass filtered and then amplified to a standard limit. After amplification, the two signals are separately differentiated. Each differentiated signal is then multiplied by the input to the other differentiator and one of the multiplier outputs is subtracted from the other. This technique is also described in U.S. Pat. No. 4,238,850 entitled TRANSMITTER/RECEIVER FOR SINGLE CHANNEL DUPLEX COMMUNICATION SYSTEMS issued on Dec. 9, 1980 to I. A. W. Vance and assigned to International Standard Electric Corporation.

In such systems, one may employ a phase-locked loop demodulator operating at the carrier frequency. The local oscillator of such a system follows the signal and the control voltage for such a local oscillator is therefore proportional to the signal deviation plus a constant. If the constant is removed, as for example by coupling, then the output is a replica of the deviation and therefore represents the modulation.

The difficulty with the demodulators of the prior art is that the stability of the criteria for the phase-locked loop prohibits sharp filters in the baseband. Accordingly, the adjacent channel selectivity suffers degradation and therefore such a receiver is extremely difficult to implement. Hence, in recognizing this problem, many prior art systems use two channels in phase quadrature. In this manner one could employ sharp filters and then one would operate on the filtered signals to demodulate them. In the present state of the art the techniques use in phase and quadrature and are referred to as I & Q systems. As indicated, these systems operate at baseband and have the capacity of detecting double sideband/single sideband, AM signals, as well as FSK signals.

The present state of the art in I & Q channel receivers uses passive components for processing the baseband signals so that they can be demodulated. In the use of passive components, one cannot employ feedback means to stabilize the receivers. In such systems each baseband signal may be differentiated, multiplied by the other undifferentiated signal and then summed. The other channel which may be the I or Q channel is treated in a similar manner. This technique is subject to the generation of noise and distortion because of circuit imbalances and imperfections. The phase errors in producing the in-phase and quadrature channels generate either noise or distortions. If there is an error in tuning, beat notes are generated which further complicate and cause improper operations.

In addition to the above described problems, there is also the problem unbalanced components such as multipliers and other circuit components, which also adds to the noise and distortions. Furthermore, the output of such a system has amplitude variations, requiring tight automatic gain control or additional complicated circuitry to circumvent the resulting imperfections.

One can use digitizing techniques to operate on the baseband signals and then to demodulate them according to such techniques. In any event, this does not eliminate the above described problems and will further introduce additional problems of aliasing and high level signal generation as necessary to operate with digital signal equipment.

It is therefore an object of the present invention to provide a simple demodulator which employs two channel operation while avoiding the above noted problems. It is a further object to provide an improved baseband demodulator which employs automatic frequency control (AFC) to thus eliminate the off tuned condition. Still another object of the invention is to develop a baseband demodulator in which the frequency of a voltage controlled oscillator used in the demodulator is independent of the carrier frequency of the incoming signal. A yet further object of the invention is so to construct the demodulator as to be capable of demodulating AM signals, even simultaneously with the demodulation of FM signals.

SUMMARY OF THE INVENTION

As will be described, the demodulator according to this invention eliminates the deleterious effects of small imperfections in phase splitting of the local oscillator. In addition, the circuit to be described can provide an automatic gain control (AGC) signal to allow higher dynamic range operation. In providing such features, the circuit does not require high gain baseband signal amplifiers. In this manner the circuit can use fixed gain amplifiers or low gain amplifiers using AGC. This has the effect of permitting the use of amplifiers with large feedback factors so that the gain and balance between the two channels is improved.

As will be described, the demodulator according to this invention is analog in nature but is of such a configuration which enables it to be simply integrated on a circuit chip.

SUMMARY OF THE INVENTION

A demodulator for frequency modulated (FM) and/or amplitude modulated (AM) received signals comprises local oscillator means for providing first and second signals in phase quadrature at the center frequency of the received signal, first and second mixing means for mixing the received signal respectively with the first and second local oscillator signals, low pass filter means for filtering each of the outputs of the first and second mixing means, third and fourth mixing means with the third mixing means having one input coupled to the output of the low pass filter means associated with the first mixer, and with the fourth mixing means having the one input coupled to the output of the low pass filter means associated with the second mixing means, variable controlled oscillator (VCO) means having an output adapted to be applied to the other inputs of the third and fourth mixers, the VCO having a control input for controlling the frequency thereof within a frequency range independent on the center frequency of the received signal, summing means having inputs coupled to the outputs of the third and fourth mixers to provide a difference signal at the output, and control means coupled between the output of the summing means and the control input of said VCO to cause the output of the summing means to provide a demodulated signal indicative of the FM modulation on the received signal.

DETAILED DESCRIPTION OF THE PREFERRED EMBODIMENTS

Figure 1:
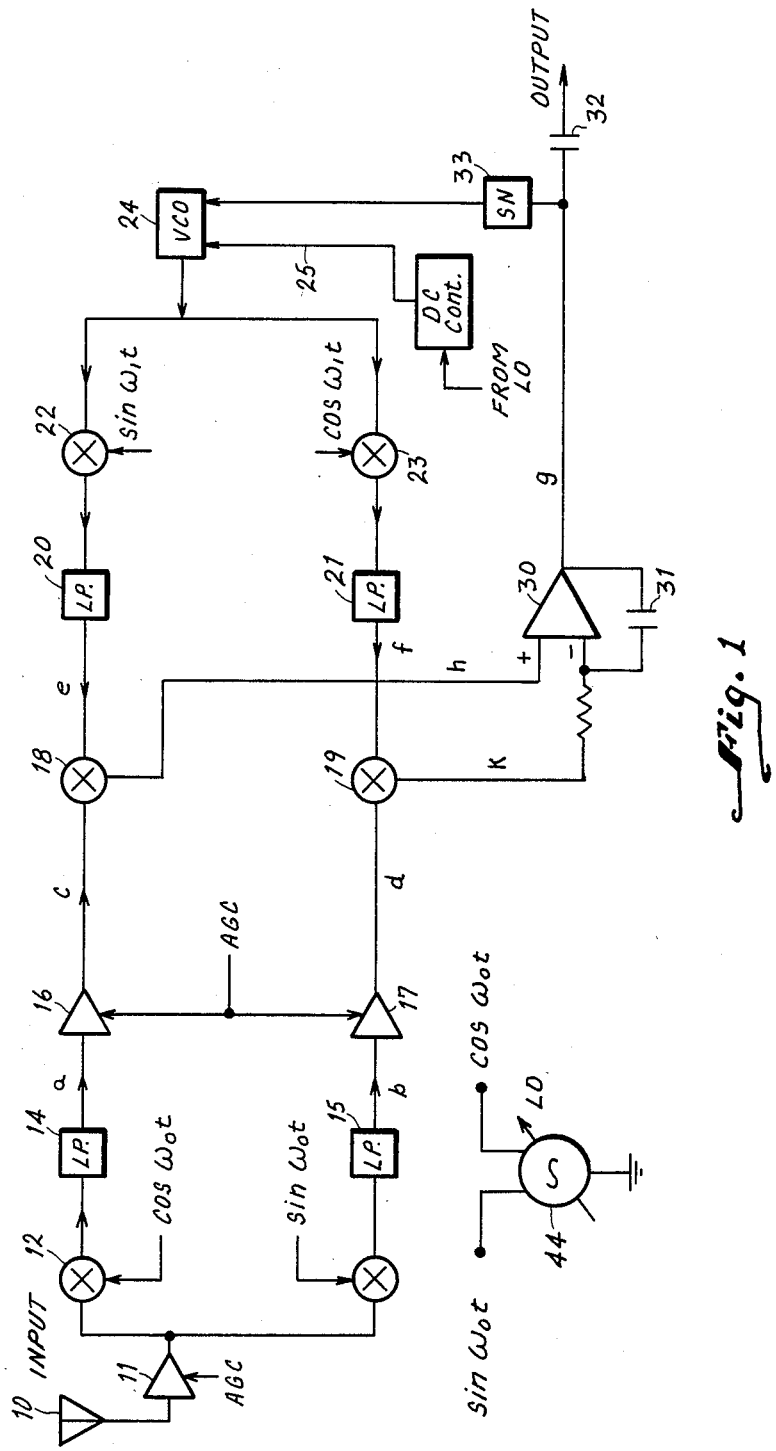
FIG. 1 is a block diagram of a baseband demodulator according to this invention.

Referring to FIG. 1, there is shown a block diagram of a receiver employing a baseband demodulator embodying this invention. A transmitted signal is received by an antenna 10 and coupled to the input of a variable gain amplifier 11. The amplifier 11 has one input designated as AGC and, as will be explained, an AGC signal which is developed by the circuitry to be described can control the gain of the preamplifier 11. The output of the amplifier 11 is directed to one input of a first mixer 12 and also to one input of a second mixer 13. Mixer circuits are well-known in the art and many examples of suitable devices exist. Each of the mixers 12 and 13 receives input from a local oscillator 44.

Essentially, the oscillator 44 includes a quadrature hybrid or some other suitable circuit to enable the oscillator 44 to produce a first signal designated as $\sin \omega_o t$ and a second signal designated as $\cos \omega_o t$. As can be seen from FIG. 1, the mixer 12 receives the $\cos \omega_o t$ while the mixer 13 receives the $\sin \omega_o t$. The local oscillator 44 may be a conventional oscillator circuit or may be a frequency synthesizer or other device which may be capable of being tuned or controlled over a desired band of operation.

Coupled to the output of the mixer 12 is a low pass filter 14. The output of the mixer 13 is similarly coupled to another low pass filter 15. The low pass filters 14 and 15 have a band width which is selected to be approximately equal to the accepted maximum deviation of the input signal from the local oscillator frequency $\omega_o$. Thus at the output of the low pass filters 14 and 15 there are obtained two signals in quadrature as will be made apparent. It is of course further understood that the local oscillator 44 has a frequency selected to provide the first and second signals which are in phase quadrature and, as will be initially assumed, at the center frequency of the input signal. These aspects of the zero-IF system are known in the prior art.

The output of the low pass filter 14 is referenced by the letter (a) while the output of the low pass filter 15 is referenced by the letter (b). The output (a) of the low pass filter 14 is coupled to the input of an amplifier 16 while the output of the low pass filter 15 is coupled to the input of an amplifier 17. The amplifiers 16 and 17 may be conventional integrated circuit amplifiers of the type exhibiting gain control which, as will be explained, is implemented by the AGC signal applied to the control terminals of the amplifiers 16 and 17. As such, amplifier configurations for the amplifiers 16 and 17 are well-known in the art and many examples exists.

As one can see from FIG. 1, the output of the amplifier 16 is designated as (c) while the output of the amplifier 17 is designated as (d). The (c) output from the amplifier 16 is coupled to one input of a second mixer or multiplier 18 basically of a configuration similar that of the mixer 12. The output (d) of the amplifier 17 is coupled to one input of another mixer 19 of the same or similar configuration as the mixer 18. Another input for the mixer 18 is derived from the output (e) of a low pass filter 20. In a similar manner, another input for the mixer 19 is derived from the output (f) of a low pass filter 21.

The low pass filter 20 has its input coupled to the output of a mixer 22, while the input of the low pass filter 21 is coupled to the output of an additional mixer 23. The mixer 22 receives a signal $\sin \omega_1 t$ which may be the same as that supplied to the mixer 13, while the mixer 23 receives a signal $\cos \omega_1 t$ which may be the same as that supplied to the mixer 12. The other inputs of the mixers 22 and 23 are derived from a voltage controlled oscillator (VCO) 24, which can be varied in frequency.

As will be explained, the VCO 24 has one input 25 which will receive a DC control voltage derived from the local oscillator 44 in order to set or tune the VCO 24 to a desired frequency. Thus, as one can see from FIG. 1, the signal processing takes place in two channels of which the upper channel includes the three mixers 12, 18 and 22 while the lower channel includes the three mixers 13, 19 and 23. The output of the mixer 18 designated as (h) is applied to the positive input terminal or non-inverting terminal of an operational amplifier 30. In a similar manner, the output of the mixer 19 designated as (k) is applied through a resistor to the inverting terminal of the operational amplifier 30. The operational amplifier 30, as will be explained, may be arranged as an integrator in that it has a capacitor 31 coupled between its output terminal (g) and its inverting terminal. The output terminal (g) of the operational amplifier 30 is AC coupled through a capacitor 32 to an output to provide an output signal which is indicative of the modulation on the input signal as received by the antenna 10, as will be explained.

The output of the amplifier 30 is also coupled through a stabilizing network (SN) 33 to a control input of the VCO 24. The stabilizing network 33 is used to control the frequency of the VCO 24 and hence, as will be explained, assures that errors which are inherent in prior art systems are eliminated. In this manner, frequency control of the VCO 24 assures that the output of the system is always proportional to the modulation and that any errors due to the imbalance between the two channels are cancelled or substantially reduced because of the automatic frequency control provided.

The operation of the above described system can best be explained in terms of the mathematical relationships which govern its operation. In the following equations which describe operation, the various signals will be designated in regard to the smaller case letters used, such as the output of the low pass filter 14 designated by (a), the output of the amplifier 16 designated by (c) and so on. The equations also use constants such as A, D and so on. The various constants used in the equations differ one from the other to indicate amplitude and various gain effects. In order to understand operation it is assumed that the input waveform as received by the antenna 10 and as amplified by the preamplifier 11 and applied to the input of the mixers 12 and 13 is as follows:

$$A' \sin(\omega_c t + \delta)$$

where $\omega_c$ is the carrier frequency and
$\delta$ is a time function representing the modulation
$A'$ = some amplitude Then at terminal (a) which is the output of the low-pass filter 14 one obtains:

$$A'' \sin[(\omega_c - \omega_o)t + \delta]$$

This signal is further amplified by the amplifier 16 to produce at the terminal (c)

$$A \sin[(\omega_c - \omega_o)t + \delta] \quad (I)$$

Similarly, at the terminal (d) which is the output of the amplifier 17, one obtains:

$$A''' \cos[(\omega_c - \omega_o)t + \delta] \quad (II)$$

In the "zero-IF" system normally the frequency $\omega_o$ is set so that it equals $\omega_c$; therefore, equations (I) and (II) reduce to:

$$A \sin \delta \quad (I')$$

$$A''' \cos \delta \quad (II')$$

For the purposes of the following discussion, and until indicated otherwise, it will be assumed that A and A''' are the same and that of $\omega_1 = \omega_o$. It is assumed that some error in the setting exists so that:

$$(\omega_c - \omega_o) = \Omega_1$$

where $\Omega_1$, is the error in setting $\omega_o$.

Now, the DC control voltage of the VCO 24 will be supplied from the frequency setting for $\omega_o$, setting the VCO 24 to some frequency $\omega_a$ near $\omega_o$. The DC control on the line 25 provides a signal according to the setting or tuning of the local oscillator 44. This control signal tunes the VCO 24 to a frequency close to but not necessarily equal to $\omega_o$. Assume the output of the VCO 24 to be:

$$\text{VCO output} = D' \sin(\omega_a t + \beta)$$

where $\beta$ is an arbitrary phase which may be time variable,
$D'$ = some amplitude different from or equal to A.

Then at terminal (e) the output is:

$$D \cos[(\omega_a - \omega_o)t + \beta] = D \cos(\Omega_2 t + \beta) \quad (III)$$

where $\Omega_2$ is error in setting $\omega_a$ $$\Omega_2 = (\omega_a - \omega_o)$$

And at terminal (f) the output is:

$$D \sin[(\omega_a - \omega_o)t + \beta] = D \sin(\Omega_2 t + \beta) \quad (IV)$$

where $\Omega_2$ is again the error in setting $\omega_a$.

The signals at terminals (c) and (e) are presented to the mixer 18. The mixer 18 may also be a multiplier as is known. For example, if the signal levels are low enough to avoid switching the respective mixer, it is a multiplier and one obtains at (h):

$$I \times III = AD \sin \quad (V)$$

And at the terminal (k), as a result of the action of the mixer 19, one obtains:

$$II \times IV = AD \cos(\Omega_1 t + \delta) \sin(\Omega_2 t + \beta) \quad (VI)$$

It may be seen that sine and cosine functions are supplied to the respective inputs of each of the mixers 18 and 19. Such mixing of different sinusoidal functions is perceived as a phase inversion. Conversely, no phase inversion would take place if only sine, or only cosine functions were mixed in either one of the mixers 18 and 19.

The two signals appearing at (h) and (k) are then subtracted by the operational amplifier 30 resulting in:

$$AD \sin(\Omega_1 t + \delta)\cos(\Omega_2 t + \beta) - \\ \cos(\Omega_1 t + \beta)\sin(\Omega_2 t + \beta) = AD \sin[(\Omega_1 - \Omega_2)t + (\delta - \beta)] \quad (VII)$$

Since this signal represents an error signal in a feedback loop, it will be driven towards zero. This can only occur when:

$$(\Omega_1 - \Omega_2) t + (\delta - \beta) \to 0$$

and that is only possible when $$\Omega_1 = \Omega_2 \text{ thus } \delta = \beta$$

The result is that $\omega_a = \omega_c$ and we have an automatic AFC action.

Furthermore, since $\delta = \beta$ and $\beta$ is proportional to the voltage present at terminal (g) in the circuit, the output indicated is proportional to $\delta$. This represents the modulating signal and is in fact the demodulated output. Thus the output from capacitor 32 is the modulation on the original signal.

The capacitor 31 in FIG. 1 could in fact be replaced by a fixed resistor. In that case, the operational amplifier 31 would no longer integrate the error signal $(\delta - \beta)$ and $\beta$ would no longer be an exact replica of $\delta$. With a high gain amplifier, however, this error could be made negligible, as is understood.

Under the condition, however, that the amplifier 31 is an integrator, and that voltage can exist at its output for a zero input, the error theoretically, at least, can be driven to zero.

Then:
$$\omega_c - \omega_o = \omega_a - \omega_o \quad \text{(AFC)}$$
$$\delta = \beta \quad \text{(demodulation)} \quad \text{(VIII)}$$

Equation VIII indicates true automatic frequency control (AFC) with a demodulated output.

Figure 2:
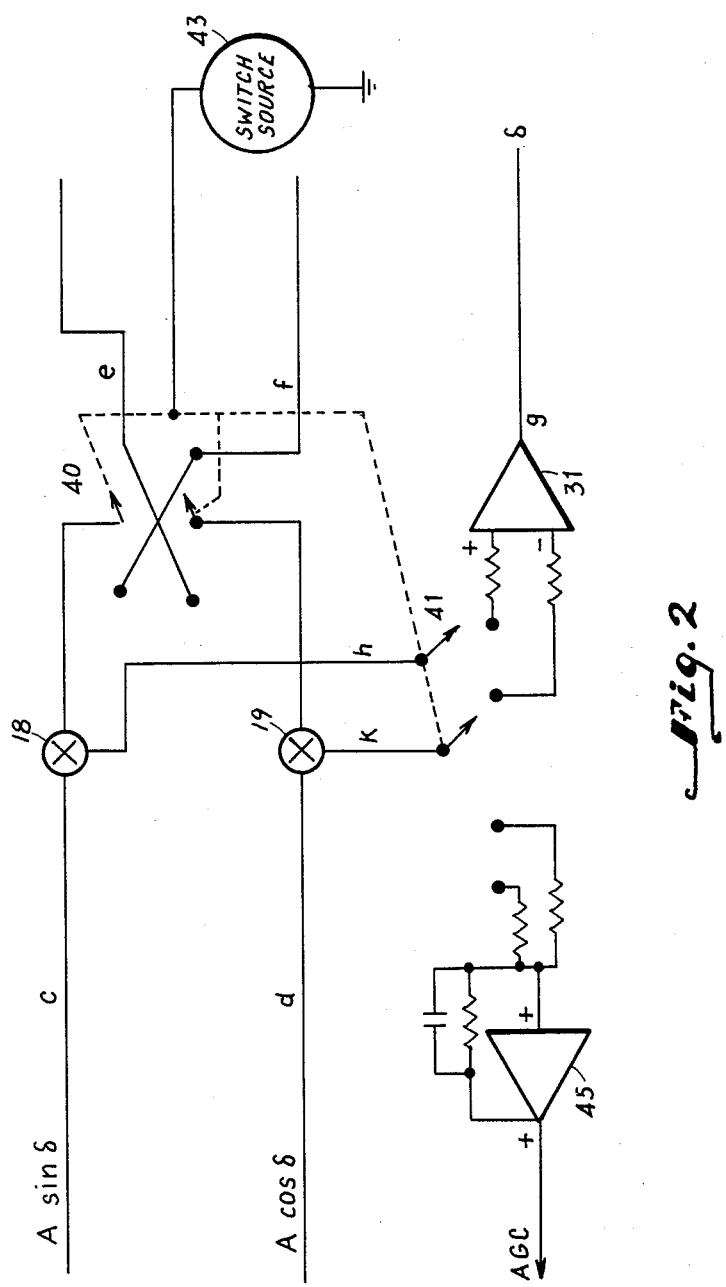
FIG. 2 is a simple block diagram depicting structure for deriving an automatic gain control signal (AGC) according to this invention.

Referring to FIG. 2, there is shown an apparatus for deriving the AGC signal which is to be used to control the gain of the pre-amplifier 11, as well as the gains of the amplifiers 16 and 17. In FIG. 2, the similar reference numerals have been retained to designate similar functioning parts.

As explained above $\omega_c$, the carrier frequency, is initially assumed to be equal to $\omega_o$, the local oscillator frequency. Therefore, the input to the mixer 18 at c is A sin $\delta$, while the input to the mixer 11 at d is A cos $\delta$. The outputs of the mixers 22 and 23 supplied to the lines e and f via the low pass filters 20 and 21 are directed to the inputs of the mixers 18 and 19 through a first double pole - double throw (DPDT) electronic switch 40. The switch 40 may be a FET circuit or a MOS circuit, where the gate electrodes are controlled by a high frequency switching signal from a source 43. The frequency of the switching signal is at least twice as high as the highest pass frequency of the input FM signal to satisfy the Nyquist theorem DPDT switches as 40 are well-known in the art and are available from many sources. In a similar manner the outputs of the mixers 18 and 19, k & h are applied to the input terminals of a second DPDT switch 41. The switch 41 switches the outputs of the mixers 18 and 19 between the amplifier 30 and a second amplifier 45. The output of the amplifier 30 still provides a signal proportional to $\beta$ and therefore a signal indicative of the modulation. The output of the amplifier 45 provides a DC signal which is proportional to the amplitude of the appropriate waveforms in the system and is directly used for AGC.

MODE OF OPERATION FOR AGC

Regarding FIG. 2, AGC is implemented as follows:

If the phases of the second set of frequencies i.e. those differring by were not inverted with respect to the first set as supplied to the corresponding inputs of the respective mixers 18 and 19 of frequencies i.e. those differing by $\Omega_1$ one would obtain $$AD \sin (\Omega_1 t + \delta) \cdot \sin (\Omega_2 t + \beta) \quad (1)$$
$$AD \cos (\Omega_2 t + \beta) \cdot \cos (\Omega_2 t + \beta) \quad (2)$$

Substracting in the same way as above is the operational amplifier 30, we would get:

$$AD [-\cos (\Omega_1 t + \beta + \Omega_2 t + \beta)]$$

which is not a useful output. However, when the phases are not inverted and we sum under the constraint that $\Omega_1 = \Omega_2$ and $\delta = \beta$ then we get (let $\Omega_1 = \Omega_2 = 0$):

$(1) + (2) = AD [\sin^2\delta + \cos^2\delta] = AD$. This is a DC term which provides AGC voltage. This can be accomplished by reversing the drive to the two mixers 18 and 19 at a rate high enough to be beyond the passband of the system as shown in FIG. 2.

As will be further explained, the circuit of FIG. 1 discriminates against most typical imperfections found in prior art device. The nature of operation is again best described by mathematics as follows:

SELF CORRECTING FEATURES

Let us now examine noise/errors due to several possible circuit imperfections.

Assume that the frequency $\omega_o$ cannot be split precisely with two waves 90° apart in phase. This represents an unavoidable error in phase splitting. We can assume that instead of sin $\omega_o t$; cos $\omega_o t$ we have:

$$\sin \omega_o t \text{ and } \cos (\omega_o t - \phi)$$

where $\phi = 0°$ to 90°

Then at the first mixers 12 and 13, one obtains:

$$\sin (\omega_o t + \delta) \cdot \cos (\omega_o t - \phi)$$

and $$\sin (\omega_o t + \delta) \cdot \sin (\omega_o t)$$

resulting in the following low pas terms from filters 14 and 15:

$$A \sin [(\omega_c - \omega_o)t + \delta + \phi]$$

and $$A \cos [(\omega_c - \omega_o)t + \delta]$$

Similarly, we have at the terminals (e) and (f) of FIG. 1:

$$D \cos [(\omega_a - \omega_o)t + \beta]$$

$$D \sin [(\omega_a - \omega_o) t + \beta + \phi]$$

Let $\omega_c - \omega_o = \omega_a - \omega_o = 0$.

Then we have at points (k) and (h) of FIG. 1 as inputs to amplifier 30 the following:

$$AD \sin (\delta + \phi) \cos \beta$$

$$AD \cos \delta \sin (\beta + \phi)$$

Expanding term-wise:

$$AD \sin (\delta + \phi) \cos \beta \; AD (\sin \delta \cos \phi + \cos \delta \sin \phi) \cos \beta$$

$$AD \cos \delta \sin (\beta + \phi) = AD (\sin \beta \cos \phi + \cos \beta \sin \phi) \cos \delta$$

Substracting (k) from (h) as before we have:

$$AD \cos \phi \sin [(\delta - \beta)] \rightarrow 0 \text{ as } \beta \rightarrow \delta$$

The only effect of an imperfect phase split is a reduction of sensitivity by the multiplying factor; cos $\phi \rightarrow 1$ as $\phi \rightarrow 0$ so that small errors are negligible.

The circuit is, therefore, self compensating for imperfect phase splitting.

In a similar manner, it can be demonstrated that distortion products (and/or errors) introduced because of inadvertent gain difference between the channels are not greater than those introduced in similar receivers not using these techniques. In fact most gain differences produce half the amount of distortion/error that other systems produce. It is in fact possible by using a second switching system as described for AGC operation to produce correcting AGC voltage for balancing the channel gains.

Due to the above described operation, the base-band demodulator or receiver can employ narrow band filters or sharp filters without causing loop instability. The use of the VCO control enables mixers 22 and 23 to provide reliable operation over a wide range while assuring that the VCO frequency is properly controlled.

Errors in both the phase generator such as the quadrature circuit and the local oscillator as well as signal errors are compensated for. The circuit, by the use of a high switching rate, enables one to develop an AGC signal for proper control of all channel and common amplifiers according to the magnitude of the true output signal. The system further enables one to demodulate either in or out of phase by alternating configurations as described.

So far, the discussion has focussed on a special case where the local oscillator sine and cosine functions were produced by the same local oscillator 44 and were in fact respectively identical, that is, where $\omega_1$ was identical to $\omega_o$. In the following, it will be shown that the arrangement of the present invention can also be used in a situation where the local oscillator frequencies supplied to the mixers or multipliers 12 and 13, on the one hand, and to the mixers or multipliers 22 and 23, on the other hand, are different from one another, that is, where $\omega_1 \neq \omega_o$. This is more generalized case which can be reduced to a number of special cases including that discussed above. Of course, the carrier frequency $\omega_c$ may differ from the local oscillator frequency $\omega_o$, and the voltage controlled oscillator output frequency $\omega_a$ may differ from the local oscillator frequency $\omega_1$, similarly to the situation described above, so that $$\Omega_1' = (\omega_o - \omega_c) \text{ and } \Omega_2' = (\omega_1 - \omega_a), \text{ or}$$

$$\omega_o = \omega_c + \Omega_1' \text{ and } \omega_1 = \omega_a + \Omega_2.$$

It may be seen from the above that, under these circumstances, four different angular frequencies are in use in the arrangement of the present inventions, that is, the carrier frequency $\omega_c$, the first local oscillator frequency $\omega_o$, the second local oscillator frequency $\omega_1$, and the voltage controlled oscillator output frequency $\omega_a$. Of course, the first and second local oscillator frequencies are made available and are being used as the respective sine and cosine functions in the same manner as discussed above.

Now, because $\omega_o$ differs from $\omega_c$ by $\Omega_1'$, the expression (I) becomes $$A \sin (\Omega_1' t + \delta), \qquad (\text{I}'')$$

and the expression (II) becomes $$A''' \cos (\Omega_1 t + \delta). \qquad (\text{II}'')$$

Here again, it will be assumed that $A = A'''$ or, in other words, that it is assured that the gains in the two channels can be kept identical or so close to one another that the difference will have only a negligible, if any effect on the demodulation process. The same assumption will also be applicable to the amplitudes D, D' and so on, as between the two channels. It is usually possible to satisfy this condition, especially if the various electronic components are arranged on a single chip so that they are operating under substantially identical operating conditions, resulting in identical gains in the two channels.

Similarly, because $\omega_1$ differs from $\omega_a$ by $\Omega_2$, the expressions (III) and (IV) become $$D \cos (\Omega_2 + \beta) \text{ and} \qquad (\text{III}'')$$

$$D \sin (\Omega_2 + \beta). \qquad (\text{IV}'')$$

Now, the functions described by the expressions (I'') and (III''), on the one hand, and those described by the expressions (II'') and (IV''), on the other hand, are supplied to the respective mixers 18 and 19, so that the expressions (V) and (VI) respectively become $$AD \sin (\Omega_1' t + \delta) \cdot \cos (\Omega_2' t + \beta) \qquad (\text{V}'')$$

and $$AD \cos (\Omega_1' t + \delta) \cdot \sin (\Omega_2 t + \beta) \qquad (\text{VI}'')$$

and by subtraction in 30, (VII) becomes $$AD \sin [(\Omega_1 + \Omega_2') + (\delta - \beta)]. \qquad (\text{VII}'')$$

It will be noted that the frequencies $\omega_1$, $\omega_o$, $\omega_a$ and $\omega_c$ are absent from the expression (VII''), so that, at least theoretically, the difference between the frequencies $\omega_1$ and $\omega_o$ can assume any arbritrary value, as can the difference between the frequencies $\omega_c$ and $\omega_a$. This may be used to advantage in designing the voltage controlled oscillator 24 such that it will have a substantially linear characteristic, which is much easier to do if the designer is not limited to a particular frequency range.

The general expression (VII'') can now be reduced to a number of special cases. So, for instance, for a situation where the difference between the second local oscillator frequency $\omega_1$ and the voltage controlled oscillator output frequency $\omega_a$ is the same as the difference between the received signal carrier frequency $\omega_c$ and the first local oscillator frequency $\omega_0$, that is, for a case where $\Omega_1' = \Omega_2'$, the expression (VII'') becomes $$AD \sin (\delta - \beta)$$

Thus, it may be seen that the same result as obtained before for $\omega_o = \omega_1$ still obtains, even though there is now a difference between the local oscillator frequencies $\omega_0$ and $\omega_1$.

Now, it will be assumed that $\Omega_1' \neq \Omega_2'$, but that $\Omega_2' = 0$, that is, $\omega_1 = \omega_a$ $$AD \sin (\Omega_1 t + \delta - \beta)$$

This means that an error has been introduced into the system, since the modulation (frequency control) of the voltage controlled oscillator 25 becomes sinusoidal. Thus, initially, the error frequency $\Omega_1'$ would be superimposed on $\beta$ at the input to the capacitor 32 and one would hear a "beat frequency". However, this error frequency $\Omega_1'$ will also be supplied to the VCO 24 and will thus sinusoidally move the output frequency $\omega_a$ of the latter until eventually the frequency $\omega_a$ will be such that there will be obtained a correction for this error signal and the feedback loop will "lock". From this point on, the term would have an additive DC term which would produce the requisite correction. The magnitude of the beat frequency would then be either greatly reduced or driven to zero.

Similarly, when it is assumed that again $\Omega_1' \neq \Omega_2'$, but this time that $\Omega_1 = 0$, that is, $\omega_1 = \omega_c$, the expression (VII") becomes $$AD \sin(\omega_2' + \delta - \beta),$$

and again an error signal will be initially present in the feedback loop, this time with the frequency $\Omega_2'$, this error signal also initially appearing at the output. However, the situation discussed above will repeat itself, that is, this error signal $\Omega_2'$ will sinusoidally move the oscillator 24 until the system "locks". By extension, it may be seen that this "locking" will also occur when both error signals $\Omega_1'$ and $\Omega_2'$ are present. The beat frequency can be almost completely eliminated by arranging intergration circuits in the h and k outputs of the respective mixers 18 and 19.

As mentioned above, the frequencies $\omega_c$ and $\omega_a$ can be independent from one another, and yet demodulation will be obtained. The only constraints in selecting the values of the frequencies used in the system are that the first local oscillator frequency $\omega_o$ be close enough to the carrier frequency $\omega_c$ that the difference frequency $\Omega_1'$ will pass through the respective filters 14 and 15, and that the voltage controlled oscillator output frequency $\omega_a$ be close enough to the second local oscillator frequency for the difference frequency $\Omega_2'$ to pass through the low pass filters 20 and 21.

Thus, it may be seen from the above explanation that the local oscillator outputs which are heterodyned with the incoming signals need not be precisely tuned to the carrier of the incoming or received signal and the local oscillator frequency and the VCO output frequency need not be in any fixed relationship to the carrier frequency or tne first-mentioned local oscillator frequency This, of course, means, that the second-mentioned local oscillator frequency need not be changed each time the first-mentioned local oscillator frequency is changed, for instance, to change the tuning of the system.

The advantages obtained from the fact that the arrangement of the present invention is capable of compensating for or eliminating frequency differences so that the frequencies supplied to the mixers 22 and 23 can be independent of and drastically differ from those supplied to the mixers 12 and 13 are that the voltage controlled oscillator (VCO) 25 can be built to operate in a convenient frequency range where components can be integrated, noise is low and the circuitry is simple, that the second local oscillator frequency is a fixed frequency so that the requisite quadrature terms can be accurately gererated by simple means, that any frequency shift due to environmental influences, thermally induced changes or the like will we corrected, that some of the noise generated in the system will be reduced, that any error (within predetermined limits) between the first local oscillator frequency and the carrier frequency will be automatically compensated for, that beat frequencies generated by imperfections in the Zero-IF circuitry will be tuned out by the AFC action of the arrangement, that the frequencies involved especially the local oscillator frequencies, can be so selected as to reduce or eliminate otherwise unavoidable coupling between the circuit elements, and that the ability to integrate the circuit arrangement on a single chip will be enhanced.

The only feature of the arrangement which is sacrificed when the arrangement is operated with the first and second local oscillator frequencies being different from one another (and thus the VCO output frequency being correspondingly different from the carrier frequency of the received signal) is the ability of the arrangement to compensate for or correct imperfections in the phase split of the local oscillator. This, however, is not a serious drawback since accurate 90° splitting can usually be achieved and, if not, there are already known relatively simple auxiliary circuits for correcting for such split imperfections.

AM DEMODULATION

Figure 3:
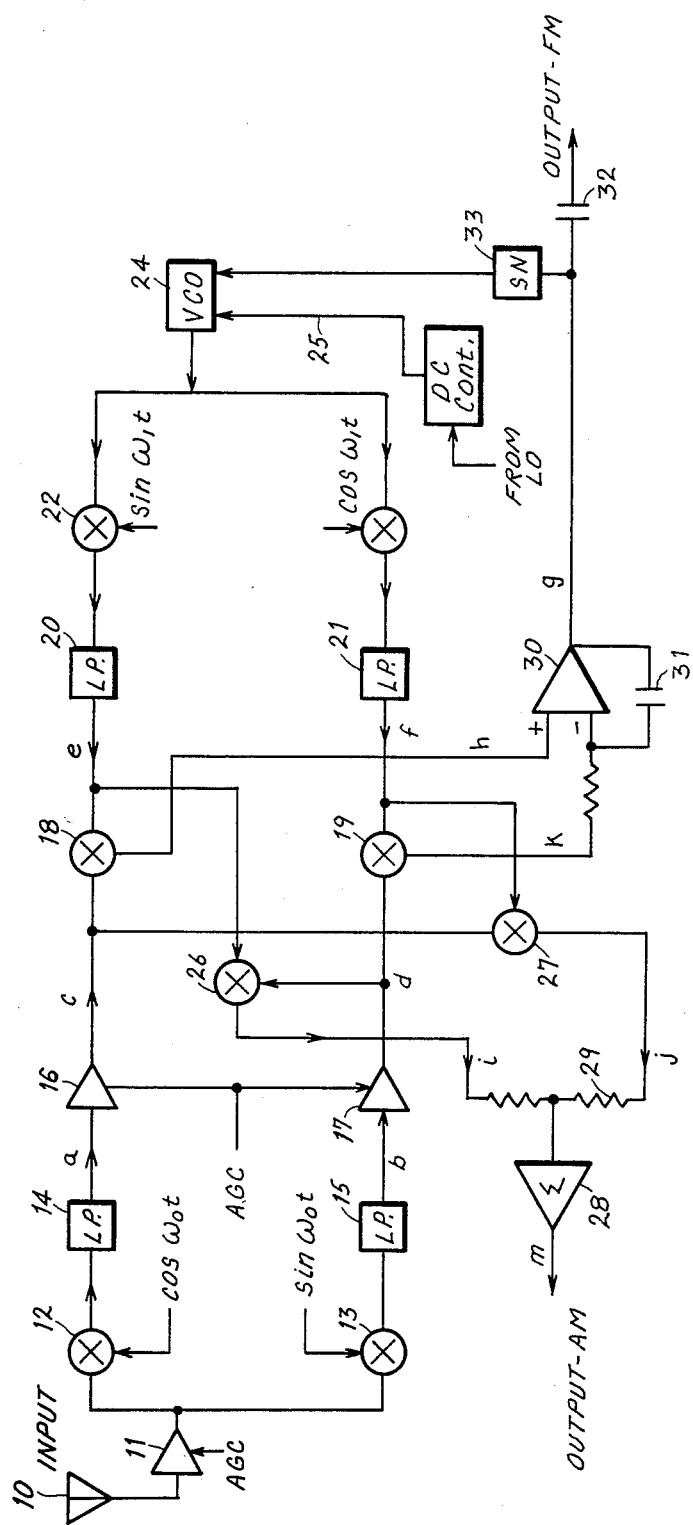
FIG. 3 is a block diagram of a modification of the baseband demodulator of FIG. 1.

Turning now to FIG. 3 of the drawing, it may be seen that the arrangement disclosed therein has a considerable number of elements and connections therein in common with the arragement depicted in FIG. 1, so that the same reference numerals and characters have been used therein to identify identical or corresponding parts and connections. However, in addition to the common components and connections, the arrangement of FIG. 3 includes two additional mixers or multipliers 26 and 27, each of which has two inputs and one input as is customary. The inputs of the mixer or multiplier 26 are respectively connected to the lines d and e, while the inputs of the mixer or multiplier 27 are connected to the lines c and f. The outputs of the mixers or multipliers 26 and 27, which are respectively designated as i and j, are connected to an amplifier 28 via a resistor 29 which acts as a voltage divider. The outputs i and j are connected to the respective ends of the resistor 29, while the amplifier 28 is connected to a tap situated substantially in the middle of the resistor 29, so that a sum of the signals appearing at the outputs i and j is supplied to, and amplified by, the amplifier 28, and the result appears at an output m of the amplifier 28.

If it is assumed now, as it was initially, that $\omega_1 = \omega_o$, and $\Omega_1' = \Omega_2' = 0$, the following results will obtain:

The FM demodulation will take place in the same manner as described before, with $\beta$ tracking $\delta$.

On the other hand, the mixers or multipliers 26 and 27 are supplied with signals which are not inverted, that is, one with two sine functions and the other with two cosine functions. Hence, the output signals of the mixers or multipliers 26 and 27 as they are supplied to the amplifier 28 are $AD \sin 2\delta$ and $AD \cos 2\delta$, and the result of their addition is $AD (\sin 2\delta + \cos 2\delta) = AD$. Hence, it may be seen that, since D is a constant, the output signal appearing at m tracks A, that is, the amplitude of the received signal.

This arrangement, thus makes it possible to simultaneously perform FM demodulation and AM demodulation. Hence, if the incoming or received signal is amplitude modulated, in addition to or instead of being frequency modulated, it is possible to obtain the demodulation of the AM signal at the output m, regardless of whether or not FM demodulation is obtained at the output of the capacitor 32. Of course, the demodulated AM signal can be further used, for instance, by suitably filtering or integrating the same in a well-known manner for the automatic gain control.

While I have described above the principles of my invention in connection with specific apparatus, it is to be clearly understood that this description is made only by way of example and not as a limitation to the scope of my invention as set forth in the objects thereof and in the accompanying claims.

I claim:

1. In a demodulator for an FM and/or AM received signal, said demodulator being of the type employing a local oscillator for providing quadrature output signals substantially at the center frequency of the received signal, and with first and second mixing means for separately mixing said quadrature output signals with the received signal to provide at their respective outputs resulting signals of a zero-IF with the sidebands folded over and extending in frequency from DC to the single sideband width of the original signal, low pass filter means associated with each output of said first and second mixing means to provide a first and a second low pass filtered signal and having a predetermined highest pass frequency, the combination therewith of apparatus for operating on said first and second low pass filtered signals to demodulate the received signal, comprising third and fourth mixing means each having a first input for respectively receiving said first and second low pass filtered signals, and a second input, a variable controlled oscillator (VCO) having a control input and an output for providing a controlled frequency, fifth and sixth mixing means each having one input coupled to said output of said VCO, and another input, and an output, with the output of said fifth mixing means being coupled to said second input of said third mixing means, and with the output of said sixth mixing means coupled to said input of said fourth mixing means, means for supplying mutually quadrature related sinusoidal signals at a frequency independent of the center frequency of the received signal respectively to said other inputs of said fifth and sixth mixing means, a difference amplifier having one input coupled to the output of said third mixing means and another input coupled to the output of said fourth mixing means for providing a difference signal at its output, means for coupling the output of said difference amplifier to said control input of said VCO to cause said output of said difference amplifier to provide a demodulated signal indicative of the modulation on the received signal, seventh and eighth mixing means each having two inputs and an output, with said inputs of said seventh mixing means being connected to said outputs of said third and fifth mixing means and with said inputs of said eighth mixing means being connected to said outputs of said fourth and sixth mixing means, and means for summing signals appearing at the outputs of said seventh and eighth mixing means to provide a demodulation of amplitude modulation of the received signal.

2. The demodulator according to claim 1 wherein said VCO further includes means responsive to said local oscillator signals for controlling said VCO to provide an output frequency close to the frequency of said local oscillator signals.

3. The demodulator according to claim 1 further including first and second low pass filters with said first filter being coupled between the output of said fifth mixing means and said second input of said third mixing means, and with said second filter coupled between the output of said sixth mixing means and said second input of said fourth mixing means.

4. The demodulator according to claim 1 further including first and second amplifier means each having an output, input and gain control terminal, with the input of said first amplifier means being responsive to said first low pass filtered signal and with the output being coupled to said first input of said third mixing means, and with the input of said second amplifier means being responsive to said second low pass filtered signal and with the output being coupled to said first input of said fourth mixing means.

5. The demodulator as defined in claim 1, wherein said summing means includes a summing amplifier.

* * * * *